United States Patent
Khalid et al.

(10) Patent No.: US 6,604,230 B1
(45) Date of Patent: Aug. 5, 2003

(54) MULTI-LOGIC DEVICE SYSTEMS HAVING PARTIAL CROSSBAR AND DIRECT INTERCONNECTION ARCHITECTURES

(75) Inventors: Mohammed A. S. Khalid, Santa Clara, CA (US); Jonathan Rose, Toronto (CA)

(73) Assignee: The Governing Counsel of the University of Toronto, Toronto (CA)

( * ) Notice: Subject to any disclaimer, the term of this patent is extended or adjusted under 35 U.S.C. 154(b) by 0 days.

(21) Appl. No.: 09/248,084

(22) Filed: Feb. 9, 1999

(51) Int. Cl.⁷ .............................................. G06F 17/50
(52) U.S. Cl. .......................... 716/16; 716/17; 716/12; 326/38; 326/47; 326/101
(58) Field of Search ............... 716/16, 17, 15, 716/4; 703/23; 326/36, 38, 39, 41, 47, 101

(56) References Cited

U.S. PATENT DOCUMENTS

| | | | |
|---|---|---|---|
| 3,106,698 A | 10/1963 | Unger | 340/172.5 |
| 3,287,703 A | 11/1966 | Slotnick | 340/172.5 |
| 3,473,160 A | 10/1969 | Wahlstrom | 340/172.5 |
| 4,539,564 A | 9/1985 | Smithson | 340/825.79 |
| 4,642,487 A | 2/1987 | Carter | 307/465 |
| 4,695,999 A | 9/1987 | Lebizay | 370/58 |
| 4,697,241 A | 9/1987 | Lavi | 364/488 |
| 4,914,612 A | 4/1990 | Beece et al. | 364/578 |
| 4,935,734 A | 6/1990 | Austin | 340/825.83 |
| 5,036,473 A | 7/1991 | Butts et al. | 364/489 |
| 5,109,353 A | 4/1992 | Sample et al. | 364/578 |
| 5,224,055 A | 6/1993 | Grundy et al. | 364/488 |
| 5,329,470 A | 7/1994 | Sample et al. | 364/578 |
| 5,352,123 A | 10/1994 | Sample et al. | 439/61 |
| 5,386,550 A | 1/1995 | Yumioka et al. | 395/575 |
| 5,414,638 A | 5/1995 | Verheyen et al. | 364/489 |
| 5,448,496 A | 9/1995 | Butts et al. | 364/489 |
| 5,452,231 A | 9/1995 | Butts et al. | 364/489 |
| 5,452,239 A | 9/1995 | Dai et al. | 364/578 |
| 5,475,830 A | 12/1995 | Chen et al. | 395/500 |
| 5,544,069 A | 8/1996 | Mohsen | 364/489 |
| 5,551,013 A | 8/1996 | Beausoleil et al. | 395/500 |
| 5,572,710 A | 11/1996 | Asano et al. | 395/500 |
| 5,574,388 A | 11/1996 | Barbier et al. | 326/41 |
| 5,596,742 A | 1/1997 | Agarwal et al. | 395/500 |
| 5,649,176 A | 7/1997 | Selvidge et al. | 395/551 |
| 5,659,716 A | 8/1997 | Selvidge et al. | 395/500 |
| 5,754,827 A | 5/1998 | Barbier et al. | 395/500 |
| 5,761,484 A | 6/1998 | Agarwal et al. | 395/500 |
| 5,777,489 A | 7/1998 | Barbier et al. | 326/40 |
| 5,790,832 A | 8/1998 | Barbier et al. | 395/500 |

OTHER PUBLICATIONS

Minnick, "A Programmable Cellular Array," undated, pp. 25–26, No date.

Shoup, "Programmable Cellular Logic," Xerox Corp., Palo Alto Research Center, Palo Alto, CA, undated, pp. 27–28, No Date.

(List continued on next page.)

Primary Examiner—Vuthe Siek
(74) Attorney, Agent, or Firm—Orrick, Herrington & Sutcliffe LLP

(57) ABSTRACT

Multi-FPGA systems (MFSs) are used as custom computing machines, logic emulators and rapid prototyping vehicles. A key aspect of these systems is their programmable routing architecture, which is the manner in which wires, FPGAs and Field-Programmable Interconnect Devices (FPIDs) are connected. The architecture disclosed uses a mixture of hardwired and programmable connections for interconnecting the FPGAs. A hardwired connection is a direct connection between a pair of FPGA I/O pins. A programmable connection refers to the scheme in which pair of FPGA I/O pins are connected using an programmable interconnect device. In the architecture disclosed, the I/O pins in each FPGA are divided into two groups: hardwired connections and programmable connections. The pins in the first group connect to other FPGAs and the pins in the second group connect to FPIDs. The FPGAs and FPIDs are interconnected using a partial crossbar architecture.

13 Claims, 10 Drawing Sheets

OTHER PUBLICATIONS

Agarwal, "Virtual Wires: A Technology for Massive Multi–FPGA Systems," Virtual Machine Works, Inc., undated, pp. 1–24, No date.

Clos, "A Study of Non–Blocking Switching Networks," The Bell System Technical Journal, vol. XXXII, Mar. 1953, pp. 126–144.

Spandorfer, "Synthesis of Logic Functions on an Array of Integrated Circuits," Contract Report AFCRL–66–298, UNIVAC Division of Sperry Rand Corp., Blue Bell, PA, Oct. 31, 1965.

Minnick, "Survey of Microcellular Research," Stanford Research Institute, Contract Report AFCRL–66–475, Jul. 1966.

Kautz, et al., "Cellular Interconnection Arrays," IEEE Transactions on Computers, vol. C–17, No. 5, May 1968, pp. 443–451.

Snyder, "Introduction to the Configurable, Highly Parallel Computer," Report CSD–TR–351, Office of Naval Research Contracts N00014–80–K–0816 and N00014–81–K–0360, Nov. 1980.

Feng, "A Survey of Interconnection Networks," Computer, Dec. 1981, pp. 12–27.

Kung, "Why Systolic Architectures?," Computer, Jan. 1982, pp. 37–46.

Pfister, "The Yorktown Simulation Engine: Introduction," $19^{th}$ Design Automation Conference Proceedings, Paper 7.1, Jun. 14–16, 1982, pp. 51–54.

Denneau, "The Yorktown Simulation Engine," $19^{th}$ Design Automation Conference Proceedings, Paper 7.2, Jun. 14–16, 1982, pp. 55–59.

Sami, et al., "Reconfigurable Architectures for VLSI Processing Arrays," AFIPS Conference Proceedings, 1983 National Computer Conference, May 16–19, 1983, pp. 565–577.

"The Homogeneous Computational Medium: new Technology for computation," Concurrent Logic, Inc., Jan. 26, 1987, pp. 1–4.

Agrawal, et al., "Mars: A Multiprocessor–Based Programmable Accelerator," IEEE Design & Test of Computers, Oct. 1987, pp. 28–36.

Beece, et al., "The IBM Engineering Verification Engine," $25^{th}$ ACM/IEEE Design Automation Conference, Jun. 12–15, 1988, Paper 17.1, pp. 218–224.

Agrawal, et al., "A Hardware Logic Simulation System," IEEE Transactions on Computer–Aided Designs, vol. 9, No. 1, Jan. 1990, pp. 19–29.

Babb, "Virtual Wires: Overcoming Pin Limitations in FPGA–based Logic Emulations," Masters Thesis, MIT, Department of EEC, Nov. 15, 1993, pp. 142–151; Also available as MIT/LCS Technical Report TR–586.

Dahl, "An Implementation of the Virtual Wires Interconnect Scheme," Masters Thesis, MIT, Department of EEC, Jan. 26, 1994, pp. 1–52; Also available as MIT/LCS Technical Report.

Tessier, et al., "The Virtual Wires Emulation System: A Gate–Efficient ASIC Prototyping Environment," FPGA 1994, $2^{nd}$ International ACM/SIGDA Workshop on Field–Programmable Gate Arrays, Feb. 13–15, 1994.

Dahl, et al., "Emulation of the Sparcle Microprocessor With the MIT Virtual Wires Emulation System," IEEE Workshop on FPGAs for Custom Computing Machines, Apr. 10–13, 1994, pp. 14–22.

Bauer, "The Design of an Efficient Hardware Subroutine Protocol for FPGAs," Masters Thesis, MIT, Deparment of EEC, May 16, 1994, pp. 1–55; Also available as MIT/LCS Technical Report.

Jones, "A Time–Multiplexed FPGA Architecture for Logic Emulation," Masters Thesis, University of Toronto, Department of EEC, 1995, pp. 1–103.

Hanono, "InnerView Hardware Debugger: A Logic Analysis Tool for the Virtual Wires Emulation System," Masters Thesis, MIT, Department of EEC, Jan. 20, 1995, pp. 1–59; Also available as MIT/LCS Technical Report.

Tessier, "Virtual Wires Pictures," article from webmaster@cag.lcs.mit.edu, Feb. 3, 1995, two pages.

Babb, et al. "More Virtual Wires," article from webmaster@cag.lcs.mit.edu, Feb. 3, 1995, one page.

Pak K. Chan, et al.; Architectural Tradeoffs in Field–Programmable–Device–Based Computing Systems, IEEE 1993; pp. 152–161.

| CIRCUIT | SIZE | FUNCTION | SOURCE, SYNTHESIS TOOL USED (IF APPLICABLE) |
|---|---|---|---|
| S35932 | 4374 LUTS, 1728 FFs, 357 I/O SIGNALS | SEQUENTIAL CIRCUIT | MCNC |
| S38417 | 6097 LUTS, 1463 FFs, 134 I/O SIGNALS | SEQUENTIAL CIRCUIT | MCNC |
| S38584 | 4396 LUTs 1451 FFs, 292 I/O SIGNALS | SEQUENTIAL CIRCUIT | MCNC |
| MIPS64 | 2900 LUTs 440 FFs, 260 I/O SIGNALS | SCALED DOWN VERSION OF MIPS R4000 | PREP, VERILOG MODEL SYNTHESIZED USING EXEMPLAR |
| SPLA | 3423 LUTs 0 FFs, 62 I/O SIGNALS | COMBINATIONAL CIRCUIT | MCNC |
| CSPLA | 2099 LUTs 0 FFs, 62 I/O SIGNALS | CLONE OF SPLA | UofT, GENERATED USING GEN [HUTT96] |
| MAC64 | 2560 LUTs 64 FFs, 133 I/O SIGNALS | 64-BIT MULTIPLY-ACCUMULATE CKT. | UofT, VERILOG MODEL SYNTHESIZED USING SYNOPSYS |
| SORT8 | 1540 LUTs 200 FFs, 20 I/O SIGNALS | 8-BIT HW SORT ENGINE | UofT, VERILOG MODEL SYNTHESIZED USING SYNOPSYS |
| FIR16 | 5366 LUTs 1040 FFs, 60 I/O SIGNALS | 16-BIT, 8-STAGE FIR FILTER | UofT, VERILOG MODEL SYNTHESIZED USING SYNOPSYS |
| GRA | 2494 LUTs 1156 FFs, 144 I/O SIGNALS | GRAPHICS ACCELERATION CIRCUIT | UofT, CIRCUIT GENERATED USING TMCC [GALL95] |
| FPSDES | 3484 LUTs 1008 FFs, 69b I/O SIGNALS | FASTEST PSEUDO DES CIRCUIT | UofT, VERILOG MODEL SYNTHESIZED USING SYNOPSYS |
| SPSDES | 2452 LUTs 982 FFs, 69 I/O SIGNALS | SMALLEST PSEUDO DES CIRCUIT | UofT, VERILOG MODEL SYNTHESIZED USING SYNOPSYS |
| OCHIP64 | 3617 LUTs | OUTPUT CHIP | UofT, VHDL |

Fig. 12

| CIRCUIT | POST ROUTING CRITICAL PATH DELAY (NS) | | | | |
|---|---|---|---|---|---|
| | Pp = 20 | Pp = 30 | Pp = 40 | Pp = 50 | Pp = 60 |
| S35932 | UNROUTABLE | UNROUTABLE | 53 | 53 | 53 |
| S38417 | 87 | 94 | 94 | 94 | 94 |
| S38584 | UNROUTABLE | 98 | 98 | 98 | 98 |
| SORT8 | UNROUTABLE | UNROUTABLE | UNROUTABLE | 460 | 499 |
| FIR16 | 147 | 160 | 163 | 167 | 167 |
| GRA | 57 | 57 | 57 | 57 | 57 |
| FPSDES | UNROUTABLE | 173 | 176 | 176 | 176 |
| SPSDES | UNROUTABLE | UNROUTABLE | 192 | 205 | 205 |
| OCHIP84 | 50 | 50 | 50 | 50 | 50 |
| IIR16 | 143 | 143 | 143 | 152 | 152 |

Fig. 15

| CIRCUIT | | NORMALIZED PIN COST | | NORMALIZED POST-ROUTING CRITICAL PATH DELAY | |
|---|---|---|---|---|---|
| | PARTIAL CROSSBAR | PRESENT INVENTION | PARTIAL CROSSBAR | PRESENT INVENTION | PARTIAL CROSSBAR | PRESENT INVENTION |
| S35932 | 8 | 9 | 1.25 | 1.0 | 1.08 | 1.0 |
| S38417 | 9 | 9 | 1.25 | 1.0 | 1.00 | 1.0 |
| S38584 | 9 | 9 | 1.25 | 1.0 | 1.42 | 1.0 |
| MIPS84 | 14 | 15 | 1.16 | 1.0 | 1.11 | 1.0 |
| SPLA | 18 | 18 | 1.25 | 1.0 | 1.16 | 1.0 |
| CSPLA | 18 | 18 | 1.25 | 1.0 | 1.18 | 1.0 |
| MAC64 | 6 | 6 | 1.25 | 1.0 | 1.34 | 1.0 |
| SORT8 | 12 | 14 | 1.07 | 1.0 | 1.07 | 1.0 |
| FIR16 | 10 | 10 | 1.25 | 1.0 | 1.43 | 1.0 |
| GRA | 4 | 4 | 1.25 | 1.0 | 1.23 | 1.0 |
| FPSDES | 9 | 9 | 1.25 | 1.0 | 1.29 | 1.0 |
| SPSDES | 8 | 8 | 1.25 | 1.0 | 1.21 | 1.0 |
| OCHIP64 | 8 | 8 | 1.25 | 1.0 | 1.26 | 1.0 |
| RALU32 | 9 | 14 | 0.80 | 1.0 | 1.21 | 1.0 |
| IIR16 | 6 | 6 | 1.25 | 1.0 | 1.05 | 1.0 |
| AVERAGE | 10 | 10 | 1.20 | 1.0 | 1.20 | 1.0 |

Fig. 16

| CIRCUIT | NUMBER OF FPGAs | | PIN COST | | POST-ROUTING CRITICAL PATH DELAY (IN NS) | |
|---|---|---|---|---|---|---|
| | PARTIAL CROSSBAR | PRESENT INVENTION | PARTIAL CROSSBAR | PRESENT INVENTION | PARTIAL CROSSBAR | PRESENT INVENTION |
| S35932 | 8 | 8 | 3032 | 2432 | 57 | 53 |
| S38417 | 9 | 9 | 3411 | 2736 | 94 | 94 |
| S38584 | 9 | 9 | 3411 | 2736 | 139 | 98 |
| MIPS64 | 14 | 15 | 5305 | 4560 | 462 | 418 |
| SPLA | 18 | 18 | 6822 | 5472 | 196 | 169 |
| CSPLA | 18 | 18 | 6822 | 5472 | 193 | 164 |
| MAC64 | 6 | 6 | 2274 | 1824 | 623 | 465 |
| SORT8 | 12 | 14 | 4548 | 4256 | 533 | 499 |
| FIR16 | 10 | 10 | 3790 | 3040 | 238 | 167 |
| GRA | 4 | 4 | 1516 | 1216 | 70 | 57 |
| FPSDES | 9 | 9 | 3411 | 2736 | 227 | 176 |
| SPSDES | 8 | 8 | 3032 | 2432 | 249 | 205 |
| OCHIP64 | 8 | 8 | 3032 | 2432 | 63 | 50 |
| RALU32 | 9 | 14 | 3411 | 4256 | 317 | 263 |
| IIR16 | 6 | 6 | 2274 | 1824 | 160 | 152 |
| | AVG.: 10 | AVG.: 10 | TOTAL: 56092 | TOTAL: 47424 | AVG.: 241 | AVG. 202 |

*Fig. 17*

MULTI-LOGIC DEVICE SYSTEMS HAVING PARTIAL CROSSBAR AND DIRECT INTERCONNECTION ARCHITECTURES

FIELD OF THE INVENTION

The present invention relates in general to architectures for multi-programmable logic device systems such as systems used for design verification. More specifically, the present invention relates to architectures for hardware logic emulation systems of electronic systems. The present invention also relates to architectures for systems used to rapidly prototype large digital electronic designs and programmable hardware implementation of algorithms (e.g., computation).

BACKGROUND OF THE INVENTION

Field Programmable Gate Arrays and other programmable logic chips (collectively referred to herein as FPGAs) are integrated circuits that can be programmed to implement various logical functions and are either one-time programmable or reprogrammable. FPGAs are widely used for implementing digital circuits because they offer moderately high levels of integration and faster implementation than other types of logic devices such as gate arrays and application specific integrated circuits ("ASICs"). Multi-FPGA systems (referred to herein as "MFSs") are collections of FPGAs joined together by a various interconnection schemes or topologies. MFSs are used when the logic capacity of a single FPGA is insufficient to implement a specific logic design. Reprogrammable FPGAs are used when quickly reprogrammable systems are desired.

The routing architecture of an MFS is the manner in which the FPGAs, fixed wires on the printed circuit boards ("PCBs") and programmable interconnect chips are connected. The choice of the routing architecture used to interconnect the FPGAs has a significant effect on the speed and cost of the system.

MFSs are used in various different technologies, including logic emulation, rapid prototyping, and reconfigurable custom computing machines. Examples of MFSs used for logic emulation, rapid prototyping and reconfigurable computing machines can be seen in U.S. Pat. Nos. 5,036,473, 5,448,496, 5,452,231, 5,109,353 and 5,475,830. The disclosures of U.S. Pat. Nos. 5,036,473, 5,448,496, 5,452,231, 5,109,353 and 5,475,830 are incorporated herein by reference in their entirety.

Hardware logic emulation is an important application for MFSs. Hardware logic emulation systems map a structural representation (commonly referred to as a netlist) of logic design such as an ASIC or a microprocessor into an MFS. In a hardware emulation system, the logic design is operated at speeds that approach real time, i.e., the speed at which the target system (the system where the actual fabricated integrated circuit will be installed) will operate. Thus, hardware logic emulation systems can emulate logic designs at speeds ranging from hundreds of Kilohertz to a few Megahertz. These speeds are several orders of magnitude faster than software design simulation speeds, which are generally restricted to at most few tens of Hertz.

Thus, hardware emulation allows functional verification of a design in its target operating environment, which includes other hardware and software modules. Many functional errors in the logic design that might not have been detected using traditional design verification methods such as software simulation can be discovered and fixed prior to fabrication of the actual integrated circuit. This is due to software simulation's long execution times. Thus very costly iterations in integrated circuit fabrication can be avoided. Reducing or eliminating the number of iterations results in reduced design costs and faster time-to-market, which are crucial in today's competitive technology market.

Many MFSs and associated CAD tools have been proposed and built for logic emulation, rapid prototyping and a wide variety of applications in custom computing. Prior art MFSs that have been previously developed range from small systems that fit on a single printed circuit board (PCB) to huge systems that use hundreds of FPGAs laid out on multiple PCBs, which in turn are mounted in many card cages and chassis. Examples of small, single PCB, prototyping systems are the MP3™ and MP4™ prototyping systems available from Aptix Corporation of San Jose, Calif. Examples of large emulation systems are the Mercury™ and System Realizer™ emulation systems available from Quicktum Design Systems, Inc. San Jose, Calif.

Overwhelming majorities of MFSs have been implemented on PCBs. However, a few MFSs based on Multi-Chip Modules (MCMs) have been proposed and built. In these Field-Programmable Multi-Chip Modules (FPMCMs), several FPGA dies are mounted on a surface within the MCM package. Interconnection resources are provided and all the logic and routing resources are packaged as a single unit. The advantages of MCM-based MFSs compared to PCB-based MFSs are reduced size, power consumption and superior speed performance. While the present application specifically refers to PCB-based implementations, the teachings of the present invention are equally applicable to MCM-based MFSs.

The routing architecture of an MFS is defined by the topology used to interconnect the FPGAs. Another distinguishing feature is whether programmable interconnect devices, also called field programmable interconnect devices ("FPIDs"), programmable interconnect chips ("PICs") or crossbars by those skilled in the art, are used for connecting the FPGAs. FPIDs can be implemented using interconnect chips, logic devices having sufficient interconnect resources and FPGAs available from such vendors as Xilinx Corporation of San Jose, Calif. and Altera Corporation of San Jose, Calif.

Prior art routing architectures can be categorized roughly in the following three ways: FPGA-only architectures, architectures that use only FPIDs for interconnecting FPGAs, and architectures that use both FPGAs and FPIDs for interconnecting FPGAs.

FPGA-only Architectures

In FPGA-only architectures, only direct hardwired connections between FPGAs are used. Thus, there are no programmable connections through FPIDs because no FPIDs are present. This class of architecture can be further sub-divided into the following three categories: linear arrays, mesh architectures, and graph connected architectures (which as will be seen below, are subdivided into three categories). These different types of FPGA-only architectures will now be described.

An example of an MFS having a linear array architecture can be seen in FIG. 1. In MFSs utilizing a linear array architecture, the FPGAs 10a–10f are arranged in the form of a linear array, which is suitable for one-dimensional systolic processing applications. Thus, each FPGA 10a–10f is directly connected to the FPGA 10a–10f linearly adjacent thereto. Using the example of FIG. 1, FPGA 10b is directly connected to FPGA 10a and FPGA 10c. Linear array architectures have extremely limited routing flexibility and many designs may run out of routing resources and hence cannot be implemented. While the architecture may perform well in certain niche applications, it's utility as a general purpose MFS is very limited.

An example of a mesh architecture is shown in FIG. 2. In the simplest mesh architecture, the FPGAs 15a–15i are laid out in the form of a two-dimensional array with each FPGA 15a–15i connected to its horizontal and vertical adjacent neighbors. Variations of this basic topology may be used to improve the routability of the architecture such as the torus and 8-way mesh as shown in FIGS. 3 and 4. The advantages of mesh architectures are simplicity of local interconnections and easy scalability. However, by using FPGAs for interconnecting to other FPGAs, and thereby using resources of the FPGA for both interconnect and logic, the amount of logic that can be implemented within each FPGA is reduced. This leads to poor logic utilization. In addition, the connection delays between widely separated FPGAs (especially in arrays comprising large numbers of FPGAs) are large whereas those between adjacent FPGAs are small. Such irregular timing characteristics results in poor speed performance and timing problems such as setup and hold time violations due to widely variable interconnection delays. Notable examples of MFSs utilizing mesh architectures are the RPM™ hardware logic emulation systems from Quickturn Design Systems, Inc., the PeRLe-1 from Digital Equipment Corporation, and the MIT Virtual Wires project.

Other FPGA-only architectures include bipartite graph, tripartite graph and completely connected graph. An example of an MFS utilizing a bipartite graph architecture can be seen in FIG. 5. In an MFS having a bipartite graph topology, the FPGAs are divided into two groups. The FPGAs in one group, FPGAs 20a, 20b, 20c, connect only to each of the FPGAs in the other group, FPGAs 25a, 25b, 25c, which is seen in FIG. 4. The tripartite graph topology (not shown) is similar, except that the FPGAs are divided into three groups and each FPGA in one group connects to every FPGA in the other two groups. In a completely connected graph topology (not shown), each FPGA is connected to every other FPGA.

A major problem with FPGA-only architectures is that they use up excessive FPGAs pins for routing high fan out inter-FPGA nets, which could cause severe routability problems. This will be discussed below in more detail.

Architectures that Employ only FPIDs for Inter-FPGA Routing In the following architectures, all the inter-FPGA connections are realized using FPIDs. In theory, an ideal architecture would be a full crossbar that uses a single FPID for connecting all FPGAs. Unfortunately, full crossbar architectures are not practical for anything other than extremely simple systems. The reason for this is that the complexity (i.e., the hardware resources required within a crossbar chip) of a full crossbar grows as a square of its pin count and hence it is restricted to systems that contain at most a few FPGAs. The partial crossbar architecture disclosed in U.S. Pat. No. 5,036,473 overcomes the limitations of the full crossbar by using a plurality of smaller crossbars. A representative example of an MFS using a partial crossbar architecture is seen in FIG. 6. In the example shown in FIG. 6, the MFS uses four FPGAs 30a–30d and three FPIDs 35a–35c. The pins in each FPGA are divided into N subsets, where N is the number of FPIDs in the architecture. All the pins belonging to the same subset in different FPGAs are connected to a single FPID. The delay for any inter-FPGA connection is uniform and is equal to the delay through one FPID. The size of the FPIDs (determined by pin count) increases only linearly as a fraction of the number of FPGAs.

The number of pins per subset ($P_t$) is a key architectural parameter that determines the number of FPIDs ($N_s$) needed and the pin count of each FPID ($P_s$). Given the values of the number of pins per subset ($P_t$), the number of FPGAs ($N_f$) in the partial crossbar and the number of I/O pins in each FPGA ($P_f$), $N_s$ and $P_s$ are given by the following formulas:

$$N_s = \frac{P_f}{P_t}$$

The extremes of the partial crossbar architecture are illustrated in FIGS. 7–8 by considering a system with four XC4013 FPGAs (192 usable I/O pins) available from Xilinx Corporation. When the value of $P_t$ is set at 192, the architecture ceases to be a partial crossbar architecture. Instead, the architecture is that of a full crossbar having one very large FPID 40. In this particular example, the FPID would have to have 768 pins (see FIG. 7). It has long been known that full crossbar architectures are not efficient for large interconnection systems. At the opposite extreme, a $P_t$ value of one will require 192 four-pin FPIDs 50–1 through 50-192 (see FIG. 8).

The examples shown in FIGS. 7 and 8 are not practical in actual systems. A preferable choice of $P_t$ will result in low cost, low pin count FPIDs. For the above example, a Pt value of twelve will require sixteen 48-pin FPIDs. In preferred embodiments presently contemplated, sixty-four or ninety-six pin FPIDs that are commercially available from vendors such as I-Cube can be used for switching circuit I/O signals between FPGAs.

Experimentation has shown that for implementing actual circuit designs in hardware emulation systems, the routability and speed of the partial crossbar is not affected by the value of $P_t$ selected. Importantly, $P_t$ value flexibility is contingent upon using an intelligent inter-chip router that understands the architecture and routes each inter-FPGA net using only two inter-chip connections to minimize the routing delay. However, one practical constraint that must be considered when designing a hardware emulation system is to avoid using $P_t$ values requiring expensive or even unavailable high pin count FPIDs.

The partial crossbar is a highly efficient architecture that provides excellent routability and reasonably good speed. In fact, the partial crossbar architecture is so efficient and flexible that for certain applications, the partial crossbar architecture provides more routing flexibility than necessary. This high level of routing flexibility has the cost of requiring more FPID pins than might be necessary for a particular implementation. As one example, consider two-terminal net routing in a system utilizing a partial crossbar architecture. All such nets have to use an FPID to connect two FPGAs. If the architecture also had direct hardwired connections between FPGAs (in addition to programmable connections through FPIDs), no FPIDs would be needed for routing certain two-terminal nets, thus saving FPID pins. The direct connections would also be faster than the connections through FPIDs and could be exploited by using them to route delay critical inter-FPGA nets. The prior art, however, does not suggest combining a partial crossbar architecture with direct connections.

Architectures That Employ Both FPGAs and FPIDs for Inter-FPGA Routing

In architectures employing both FPGAs and FPIDs for Inter-FPGA routing, both FPGAs and FPIDs are used to provide inter-FPGA routing paths. Examples of systems using this type of architecture are the Altera RIPP10, the Splash 2 and the VCC virtual computer. No systematic study has been performed to evaluate these prior art systems' effectiveness in implementing actual circuits. Moreover, these prior art topologies are very difficult to scale, i.e., they are not suitable for implementing very large MFSs. Simple scaling of these topologies to implement large MFSs would most likely lead to severe routability and speed problems.

There has been a long felt need for an interconnect architecture that has the flexibility, efficiency, and scalability of the partial crossbar architecture, but with comparable routability, even lower cost, and capable of higher speed.

SUMMARY OF THE INVENTION

A new type of multi-FPGA routing architecture is disclosed and claimed that overcomes routability, cost and speed issues associated with existing routing architectures by using a mixture of hardwired and programmable connections and a unique topology for interconnecting FPGAs.

In one aspect of the present invention, the present invention comprises an architecture for a multi-FPGA system comprised of both fixed and programmable interconnections. The fixed interconnections directly interconnect each FPGA of a system to every other FPGA of the system. The programmable interconnections interconnect each FPGA to every other FPGA through a programmable interconnect device.

A structure utilizing the teachings of the present invention comprises of a plurality of reprogrammable logic devices. Each reprogrammable logic devices has configurable logic elements for implementing logical functions. Each reprogrammable logic devices also comprises programmable input/output terminals, which can be reprogrammably connected to selected ones of the configurable logic elements of the reprogrammable logic devices. The structure utilizing the teachings of the present invention also comprises a plurality of reprogrammable interconnect devices. Each of the reprogrammable interconnect devices has input/output terminals and internal circuitry which can be reprogrammably configured to provide interconnections between selected ones of the input/output terminals. The structure utilizing the teachings of the present invention also comprises a first set of fixed electrical conductors which connect a first group of the programmable input/output terminals on the plurality of reprogrammable logic devices to the input/output terminals on the reprogrammable interconnect devices such that each of the reprogrammable interconnect devices is connected to at least one but not all of the programmable input/output terminals of the first group of the programmable input/output terminals on each of the plurality of reprogrammable logic devices. Finally, a structure utilizing the teachings of the present invention comprises a second set of fixed electrical conductors connecting a second group of the programmable input/output terminals on the plurality of reprogrammable logic devices to the second group of input/output terminals on every other of the plurality of reprogrammable logic devices.

In another aspect of the present invention, an MFS using the teachings of the present invention comprises a plurality of reprogrammable logic devices. Each of the plurality of reprogrammable logic devices comprises a plurality of configurable logic elements and each of the plurality of reprogrammable logic devices also comprises programmable input/output terminals which can be programmed to connect to selected ones of the configurable logic elements. Such an MFS utilizing the teachings of the present invention also comprises a plurality of reprogrammable interconnect devices. Each of the reprogrammable interconnect devices has input/output terminals and internal circuitry which can be reprogrammably configured to provide interconnections between selected ones of the input/output terminals on the plurality of reprogrammable interconnect devices. Such an MFS also comprises a first set of fixed electrical conductors connecting a first group of the programmable input/output terminals on the plurality of reprogrammable logic devices to the input/output terminals on the reprogrammable interconnect devices such that each of the reprogrammable interconnect devices is connected to at least one but not all of the programmable input/output terminals of the first group of the programmable input/output terminals on each of the plurality of reprogrammable logic devices. This MFS also comprises a second set of fixed electrical conductors connecting a second group of the programmable input/output terminals on the plurality of reprogrammable logic devices to the second group of input/output terminals on every other of the plurality of reprogrammable logic devices. Finally, this MFS using the teachings of the present invention comprises an interface structure arranged to provide signal paths for signals carrying information to or from designated ones of the configurable logic elements in the reprogrammable logic devices.

In another aspect of the present invention, an MFS utilizing the teachings of the present invention comprises an electrically reconfigurable logic assembly for use in an electrically reconfigurable hardware emulation system. The reconfigurable system can be configured with a circuit design in response to the input of circuit information. The MFS using the teachings of the present invention comprises a plurality of FPGAs. Each of the plurality of FPGAs has internal circuitry which can be reprogrammably configured to provide logic functions. Each of the plurality of FPGAs also has programmable input/output terminals that can be reprogrammably connected to the internal circuitry of the plurality of FPGAs. In this aspect of the invention, the MFS comprises a plurality of FPIDs. Each of the FPIDs have input/output terminals and internal circuitry which can be reprogrammably configured to provide interconnections between selected ones of the input/output terminals. This aspect of the present invention also comprises a first set of fixed electrical conductors connecting a first group of the programmable input/output terminals on the plurality of FPGAs to the input/output terminals on the FPIDs. This interconnection is such that each of the FPIDs is connected to at least one but not all of the programmable input/output terminals of the first group of programmable input/output terminals on each of the plurality of FPGAs. This aspect of the present invention also comprises a second set of fixed electrical conductors connecting a second group of the programmable input/output terminals on the plurality of FPGAs to the second group of input/output terminals on every other of the plurality of FPGAs.

In another aspect of the present invention, an electrically reconfigurable logic board for use in an electrically reconfigurable hardware emulation system is disclosed which comprises a logic board structure comprising a printed circuit board. A plurality of FPGAs are mounted on the logic board structure. Each of the plurality of FPGAs has internal circuitry that can be reprogrammably configured to provide logic functions. Each of the plurality FPGAs also has programmable input/output terminals that can be reprogrammably connected to the internal circuitry within each FPGAs. This aspect of the present invention also comprises a plurality of FPIDs mounted on the logic board structure.

Each of the FPIDs has input/output terminals and internal circuitry that can be reprogrammably configured to provide interconnections between selected ones of the input/output terminals. This aspect of the present invention also comprises a first set of fixed electrical conductors connecting a first group of the programmable input/output terminals on the plurality of FPGAs to the input/output terminals on the FPIDs such that each of the FPIDs is connected to at least one but not all of the programmable input/output terminals of the first group of the programmable input/output terminals on each of the plurality of FPGAs. This aspect of the present invention also comprises a second set of fixed electrical conductors connecting a second group of the programmable input/output terminals on the plurality of FPGAs to the second group of input/output terminals on every other of the plurality of FPGAs.

The above and other preferred features of the invention, including various novel details of implementation and combination of elements will now be more particularly described with reference to the accompanying drawings and pointed out in the claims. It will be understood that the particular methods and circuits embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

Reference is made to the accompanying drawings in which are shown illustrative embodiments of aspects of the invention, from which novel features and advantages will be apparent.

FIG. 12 is a table showing the details of exemplary benchmark circuits used to determine optimal interconnect resourses in an MFS using the architecture of the present invention.

FIG. 15 is a table showing the effect of the choice of Pp (i.e., the percentage of each FPGA's pins that are connected to FPIDs) on the speed of the architecture of the present invention.

FIG. 16 is a table comparing pin cost and post-routing critical delay path performance of the architecture of the present invention and the partial crossbar architecture. The pin cost and delay values for each benchmark circuit in this table are normalized to the pin cost and the critical path delay obtained by the architecture of the present invention for that particular circuit.

FIG. 17 is a table comparing actual pin cost and actual post-routing critical path delay performance of the architecture of the present invention and the partial crossbar architecture.

DETAILED DESCRIPTION OF THE DRAWINGS

Turning to the figures, the presently preferred apparatus and methods of the present invention will now be described.

Figure 1:
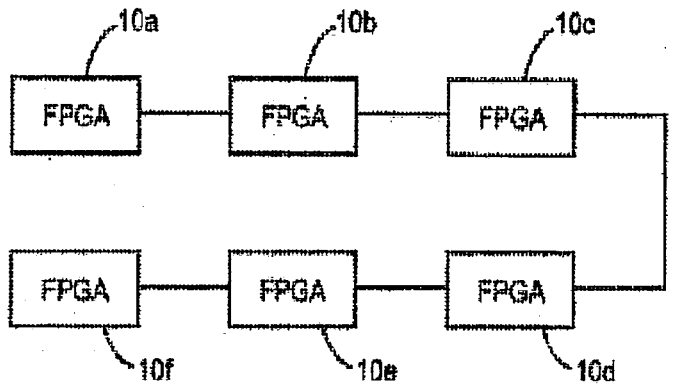
FIG. 1 is a block diagram of an MFS utilizing a linear array architecture.
Figure 2:
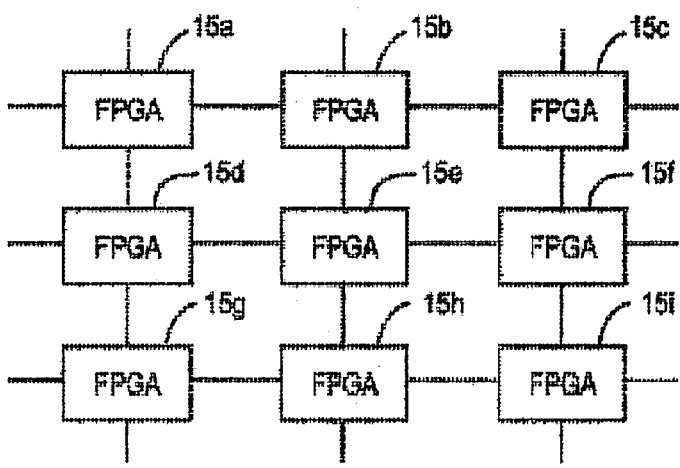
FIG. 2 is a block diagram of an MFS utilizing a four-way mesh or "nearest neighbor" architecture.
Figure 3:
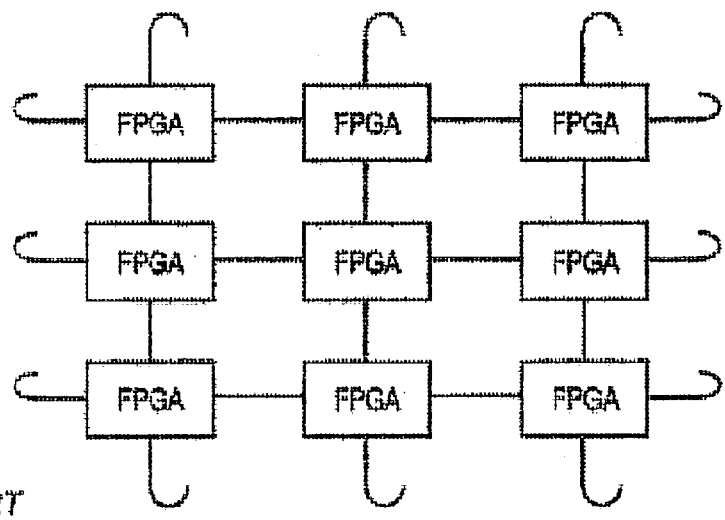
FIG. 3 is a block diagram of an MFS utilizing a four-way torus architecture.
Figure 4:
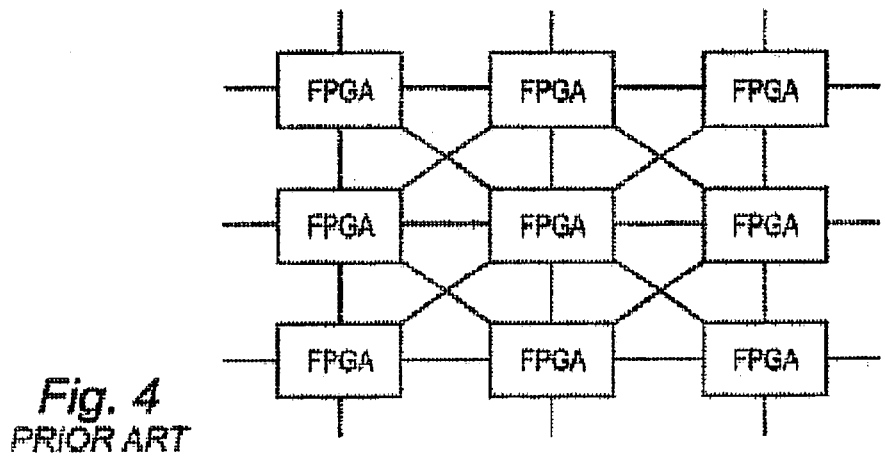
FIG. 4 is a block diagram of an MFS utilizing an eight-way mesh architecture.
Figure 5:
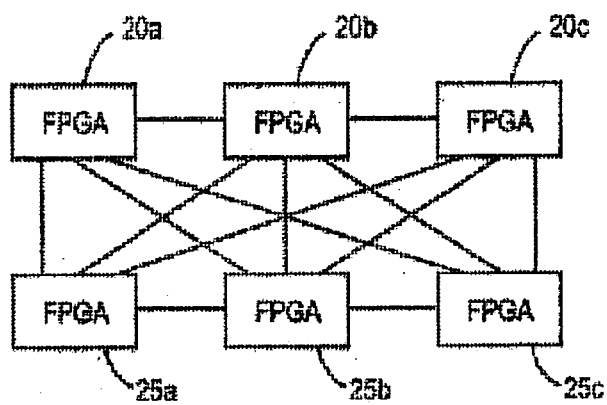
FIG. 5 is a block diagram of an MFS utilizing a bipartite graph architecture.
Figure 6:
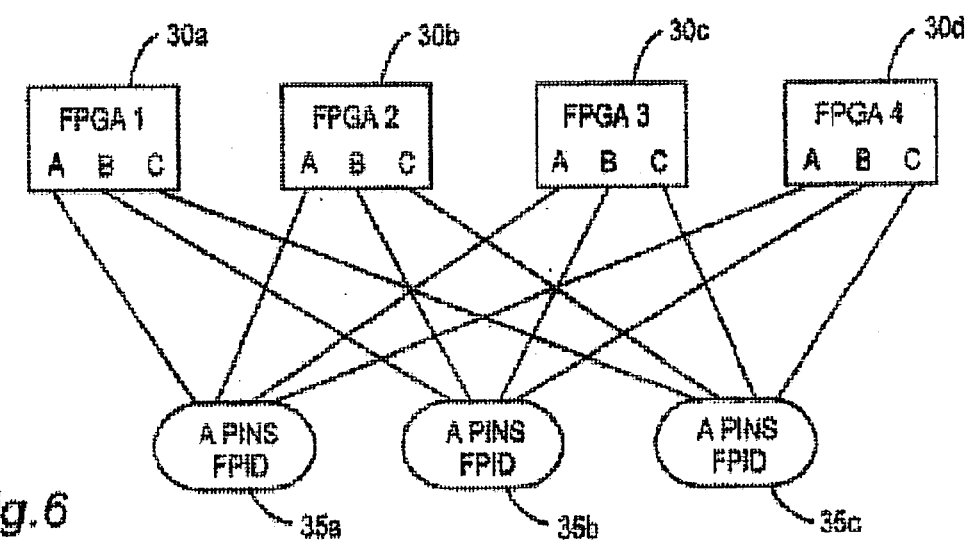
FIG. 6 is a block diagram of an MFS utilizing a partial crossbar architecture.
Figure 7:
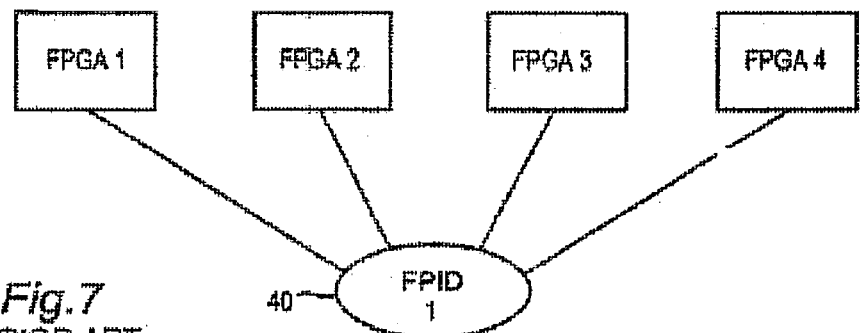
FIG. 7 is a block diagram of an MFS utilizing a full crossbar architecture requiring an interconnect device having 768 pins.
Figure 8:
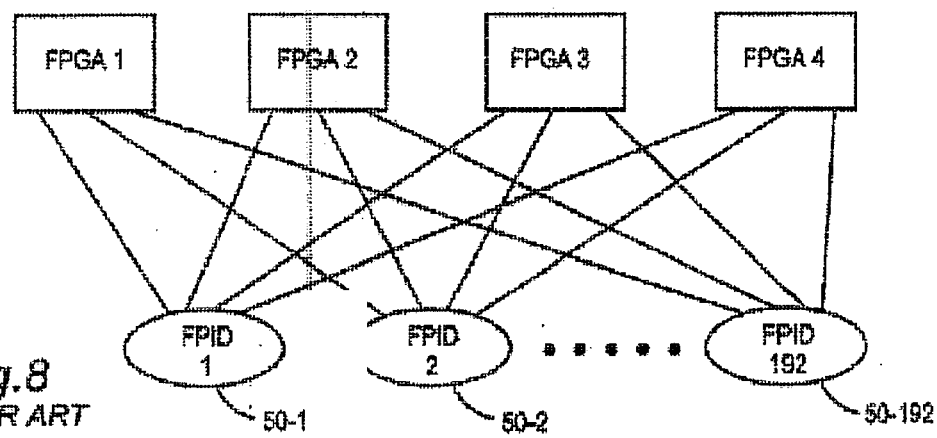
FIG. 8 is a block diagram of an MFS utilizing a partial crossbar architecture requiring one hundred ninety-two interconnect devices.
Figure 9:
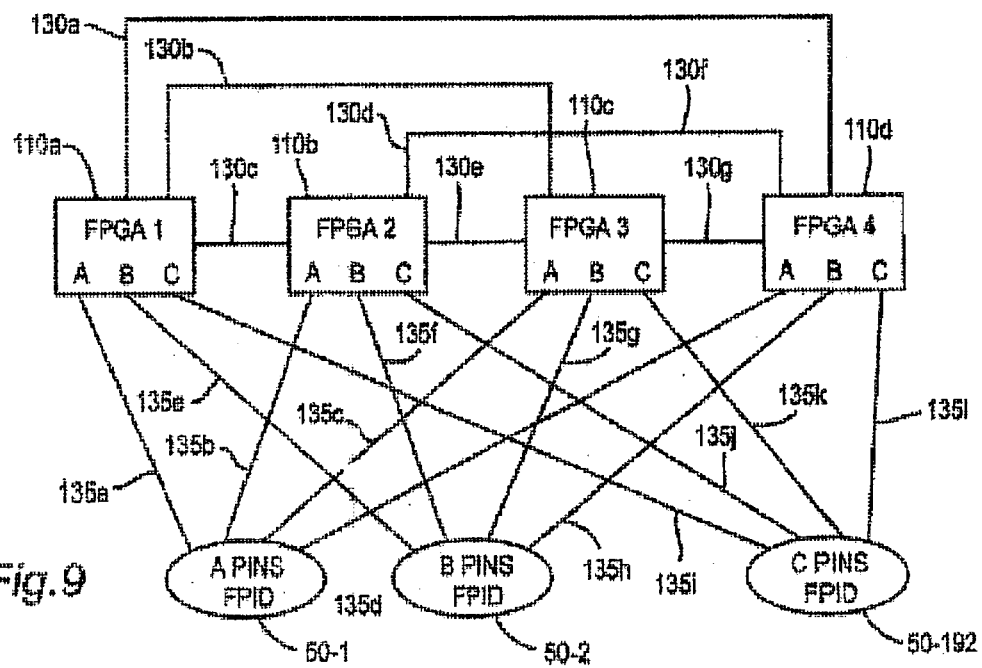
FIG. 9 is a block diagram of the architecture of an MFS using the architecture of the present invention.

An exemplary MFS 100 having the architecture of the present invention is shown in FIG. 9. In this example, the MFS 100 has four FPGAs 110$a$–110-$d$ and three FPIDs 120$a$–120$c$. However, it is understood that the MFS shown in FIG. 9 is only an example, as the architecture of the present invention can be utilized in MFSs having many more FPGAs and FPIDs than the quantities shown in FIG. 9. The input/output ("I/O") pins in each FPGA 110$a$–110$d$ are divided into two groups: those having hardwired connections 130$a$–130$g$ and those having programmable connections 135$a$–135$l$. The pins in the first group (the hardwired connections) 130$a$–130$g$ connect to other FPGAs 110$a$–110$d$ and the pins in the second group (the programmable connections) 135$a$–136$l$ connect FPGAs 110$a$–110$d$ to FPIDs 120$a$–120$c$. In the presently preferred embodiment, the hardwired connections between FPGAs 110$a$–110$d$ form a complete graph topology, i.e., each FPGA 110$a$–110$d$ is directly connected to every other FPGA 110$a$–110$d$. The connections between FPGAs are evenly distributed, i.e., the number of wires between every pair of FPGA 110$a$–110$d$ is the same.

Figure 18:
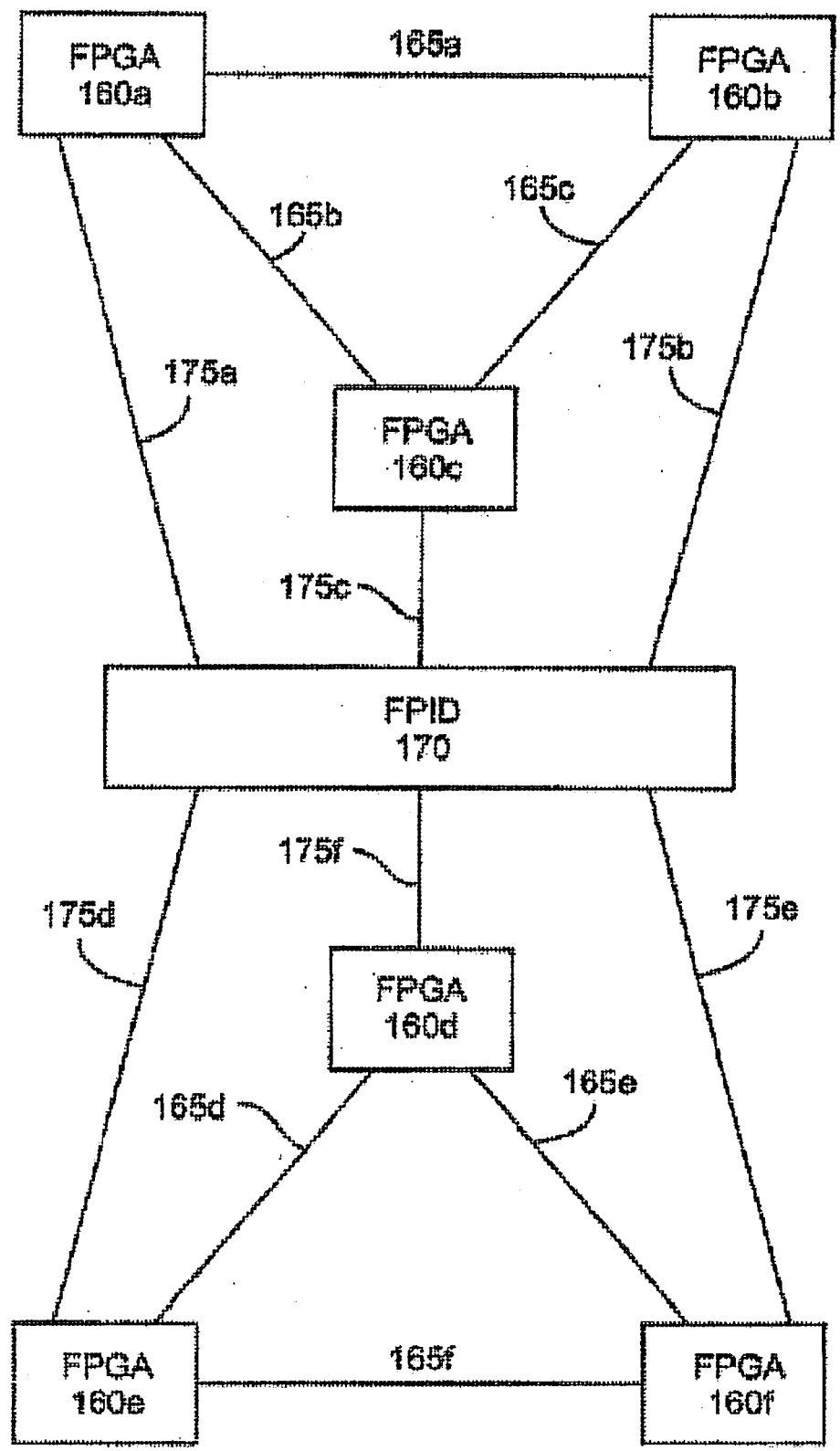
FIG. 18 is another example of an MFS using both hardwired and programmable connections.

In the presently preferred embodiment, the programmable connections 135$a$–135$l$ that interconnect FPGAs 110$a$–110$d$ through FPIDs 120$a$–120$c$ are implemented with a partial crossbar architecture. As in the partial crossbar architecture discussed above, any primary circuit input/output signal connecting a part of logic within an FPGA to the outside world (e.g., the target operating environment) has to go through an FPID. For this purpose, any suitable number of pins per FPID can be reserved for circuit I/Os. Hierarchical connections are also contemplated by the present invention, as is shown in FIGS. 17, 18 and 19 of U.S. Pat. Nos. 5,036,473, 5,448,496 and 5,452,231. In a heirarchical archetecture, there are multiple printed circuit boards connected together by interconnect boards in a chassis. Multiple chassis can also be interconnected to each other using a partial crossbar architecture.

Direct connections between FPGAs 110$a$–110$d$ can be exploited to obtain reduced cost and better speed. For example, consider a net 142 that interconnects FPGA 140$a$ to FPGA 140$d$ in FIG. 10. If there were no direct connections as provided by the architecture of the present invention, and only a partial crossbar architecture was present, an FPID would interconnect the FPGA 140a to FPGA 140d. Thus, a signal on a pin on FPGA 140a would have to travel to a pin on an FPID. The FPID would switch the signal such that it is output on another pin on the same FPID. The signal would then travel to another pin on FPGA 140d. Thus, utilizing only a partial crossbar architecture would result in extra delay that would not have been present had FPGA 140a been directly connected to FPGA 140d. The partial crossbar architecture also required two extra pins on the FPID that would not have been necessary had direct connections been available.

Figure 10:
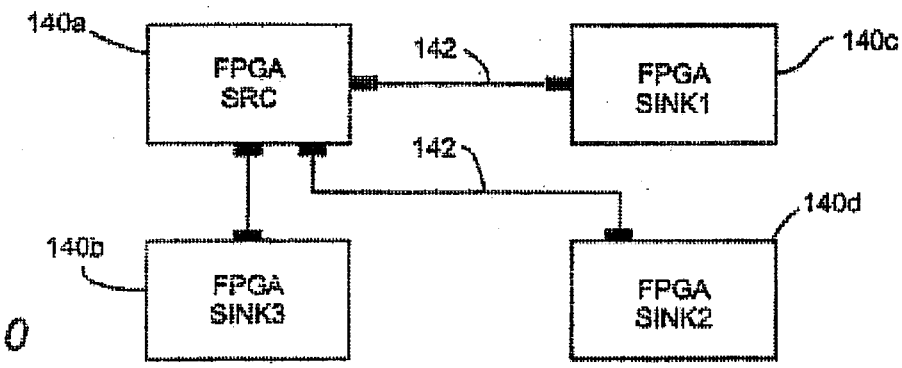
FIG. 10 is a block diagram illustrating multi-terminal routing of a net having fan out greater than one when the MFS does not utilize an programmable interconnect device.

This above example, however, does not mean that the partial crossbar architecture should be abandoned. As discussed above, the partial crossbar has many advantages over the direct connection architectures described above. As discussed above, routing multi-terminal nets (i.e., nets having a fan out greater than one) in an FPGA-only architecture are expensive in terms of routability because in such an architecture, multi-terminal net require many extra pins on the source FPGA. This can be seen with reference to FIG. 10. In FIG. 10, two extra FPGA pins are used on FPGA 140a so that a net 142 having a fan out of three can be properly routed to three different FPGAs 140b, 140c and 140d. Since extra pins are scarce on FPGAs, FPGA-only architectures have adverse effects on routability of multiple fan out nets.

Figure 11:
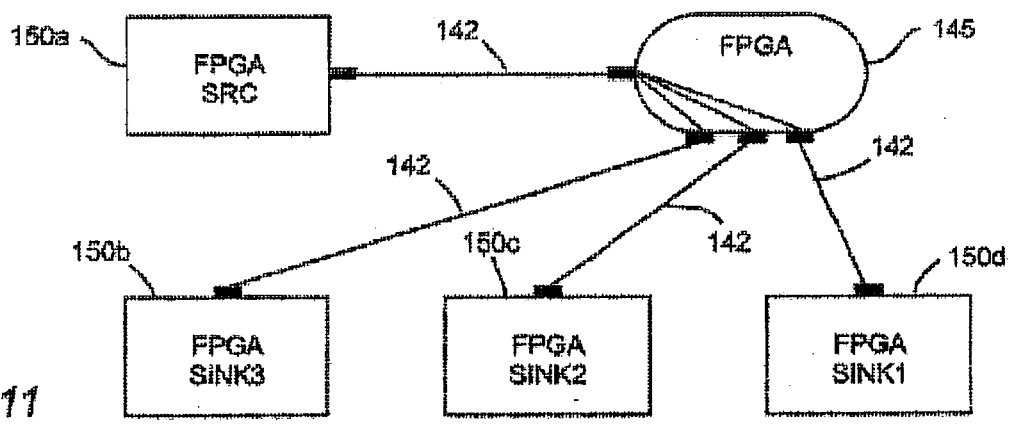
FIG. 11 is a block diagram illustrating multi-terminal routing of a net having fan out greater than one when the MFS utilizes an programmable interconnect device.

In comparison, partial crossbar architectures are highly advantageous when routing nets having fan outs greater than one. Using the same net used with reference to FIG. 11, the advantages of using a partial crossbar architecture with multiple fan out nets can be seen. Referring to FIG. 11, it is seen that in a partial crossbar architecture, an FPID 145 routes the same multi-terminal net 142 from FPGA 150a to FPGAs 150a, 150b and 150c. No extra FPGA pins are needed, except for FPGA pins needed to access the source and sinks of the net.

A key architectural parameter of the architecture of the present invention is the percentage of programmable connections, Pp. Pp is defined as the percentage of each FPGA's pins that are connected to FPIDs (contrasted to the remaining pins, which are connected to other FPGAs or to overhead such as power, ground, programming, etc.). If Pp is too high, it will lead to increased pin cost. In contrast, if Pp is too low, it will adversely affect routability. Examples of extremes include having a value of Pp that is zero percent. When Pp is zero percent, the architecture is a completely connected graph of FPGAs using no FPIDs. When Pp is one hundred percent, a partial crossbar architecture results. Determining the optimal value of Pp is critical so that minimum cost and good routability can be obtained.

The complete graph topology for the hardwired connections provides adequate routing flexibility under certain circumstances. The reason for this is that for connecting any pair of FPGAs, a direct connection between them can be used. Once the direct connections are exhausted, any FPGA outside the pair can be utilized to supply a routing path, provided it has enough free pins for routing.

A number of CAD tools are required for automatically mapping a large digital circuit into the architecture of the present invention. "Mapping" is the process for configuring the architecture of the present invention to implement given circuit. More specifically, a customized set of circuit partitioning, inter-FPGA routing tools are required. An intelligent, architecture-specific inter-FPGA routing tool is crucial for obtaining good routability and speed for the architecture of the present invention. Vendor supplied technology in placement, routing, and configuration tools can be used for implementing partitioned sub-circuits on individual FPGAs. One such program is the XACT software available for FPGAs for Xilinx FPGAs. The FPIDs can also be configured as per the specifications of the inter-FPGA router using the configuration tools supplied by the FPID vendor.

CAD Tools, Architectural Issues, Analysis and Evaluation

The architecture of the present invention was evaluated and compared to the best of the prior art (the partial crossbar architecture) by using a rigorous experimental approach that employs real benchmark circuits. Exemplary benchmark circuits are disclosed in the table in FIG. 12. A total of fifteen large benchmark circuits were used. The table in FIG. 12 provides the circuit name, size (in four look-up tables, D flip-flops, and I/O count), rough description of the functionality, the source of the circuit and the manner in which it was synthesized.

Four circuits were obtained from the Microelectronics Center of North Carolina (referred to as MCNC in the table of FIG. 12) and two from industry standard FPGA benchmarks available from Programmable Electronics Performance Corp. (referred to as PREP in the table of FIG. 12). The remaining nine benchmark circuits were developed at the University of Toronto (referred to as UofT in the table of FIG. 12).

The benchmark circuits are mapped into the architectures using a customized set of partitioning, placement and inter-chip routing tools. The architectures are compared on the basis of cost (the total number of pins required in the system) and speed (determined by post inter-chip routing critical path delay). Using the experimental approach, the proportion of hard-wired connections versus programmable connections was explored in an attempt to determine its optimal value.

CAD Flow

Figure 13:
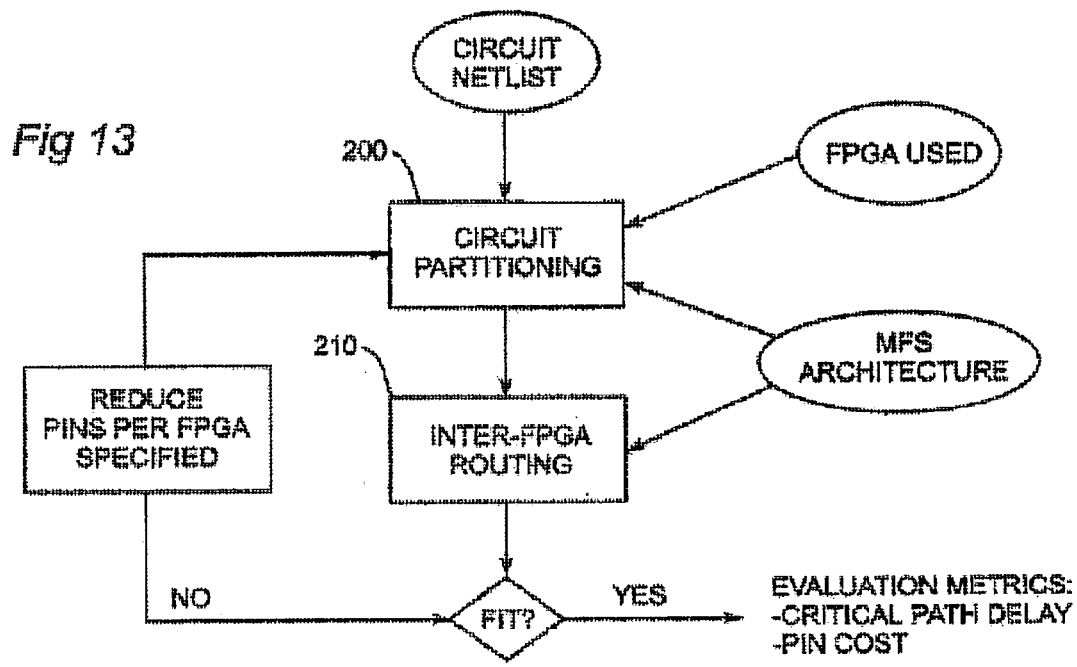
FIG. 13 is a flow chart showing the method of evaluating an MFS to determine optimal interconnect resourse allocation, and for comparison to other MFS architectures.

FIG. 13 is a flow chart illustrating a method used to evaluate MFS routing architectures for various parameters such as speed, cost and efficiency. As an example, one can utilize a technology mapped netlist comprised of four-input look up tables (referred to as "4-LUTs") and flip flops. The first step in the evaluation is the partitioning step 200 where the netlist of the circuit design to be implemented in the MFS is partitioned into a minimum number of sub-circuits. Many different partitioning software packages are available. For example, one can use a multi-way partitioning tool which has certain critical information input thereto, such as the logic capacity and pin count of the FPGA to be used in the MFS undergoing evaluation. For all the experiments referred to herein, the inventors used a Xilinx XC4013E-1 Logic Cell Array as the FPGA. This particular FPGA comprises 1152 4-LUTs, 1152 flip-flops, and 192 usable I/O pins. This information was input into the partitioning program. Multi-way partitioning can be accomplished using a recursive bipartitioning procedure. The partitioning tool used is called 'part' and was originally developed for the Transmogrifier 1 rapid prototyping system developed at the University of Toronto, Canada. It is based on the Fiduccia and Mattheyses partitioning algorithm with an extension for timing-driven pre-clustering. The output of the partitioning step is a netlist description of connections between the FPGAs that will have the circuit implemented therein.

Given the chip-level interconnection netlist produced during the partitioning step 200, the next step is the routing step 210 where each inter-FPGA net is routed using the most suitable routing path. The routing path chosen should be the shortest path (using the minimum number of inter-chip connections) and should cause the least possible congestion for subsequent nets to be routed. Utilizing the architecture of the present invention, the routing resources available in an MFS could be wires that are direct connections between FPGAs or wires that connect FPGAs to other FPGAs through FPIDs, depending on the architecture of the MFS.

If the routing attempt fails, the partitioning step 200 is repeated after reducing the number of I/O pins per FPGA specified to the partitioner. This usually increases the number of FPGAs needed, and helps routability by decreasing the pin demand from each FPGA, and providing more "route through" pins in the FPGAs which facilitate routing. Note that in an actual MFS, the inter-FPGA routing step is followed by pin assignment, placement and routing within individual FPGAs. However, when modeling a particular MFS in an attempt determine the optimal architecture, these tasks are unnecessary because only the MFS size needed to fit the circuit is needed.

Previous research has shown that pins can be randomly assigned for each FPGA without jeopardizing routability and speed. During recursive bipartitioning, the logic utilization of each FPGA is restricted to be at most 70% to avoid placement and routability problems within individual FPGAs. The reason for this is that if an inter-FPGA routing attempt succeeds, it is almost guaranteed that the subsequent pin assignment, placement, and routing steps will be successful for each FPGA in the MFS.

The router used in routing step 210 should exploit the fast hardwired connections in the architecture of the present invention to obtain good speed performance. Such a router is described in the PhD thesis, *Routing Architecture and Layout Synthesis for Multi-FPGA Systems*, by Mohammed A. S. Khalid, one of the inventors of the present invention, which can be obtained from the University of Toronto, Toronto, Canada. This particular router uses path-based static timing analysis to identify the critical nets and tries to route them using fast hardwired connections, whenever possible.

Architectural Issues and Analysis

As discussed, in certain circumstances, the partial crossbar architecture provides more routing flexibility than is necessary for certain MFSs. This increased flexibility has a cost, which is the requirement of extra FPID pins. An example of the increased pin requirements of the partial crossbar architecture was discussed above. The architecture of the present invention utilizes the flexibility of the partial crossbar, but also includes a plurality of direct connections between FPGAs. Thus, the architecture of the present invention utilizes a combination of both programmable (e.g., partial crossbar) and hardwired (e.g., direct connections) connections. By utilizing both programmable and hardwired connections, the present invention provides lower cost and higher speed when compared to architectures utilizing only partial crossbar. The hardwired connections are most suitable for routing two-terminal nets that connect any pair of FPGAs and can also be exploited to improve the speed performance. The programmable connections are best suited for routing multi-terminal nets, i.e., nets having fan outs greater than one. Thus the present invention provides excellent inter-FPGA routing flexibility and a good mixture of routing resources for efficient routing of both two-terminal and multi-terminal nets. Since many designs that a user would like to implement contain both two-terminal nets and multi-terminal nets, the architecture of the present invention can efficiently implement many types of designs more efficiently than designs using either the partial crossbar or nearest neighbor architectures of the prior art.

Another advantage of the architecture of the present invention as used in an MFS when compared to an MFS utilizing a partial crossbar architecture is reduced board-level wiring complexity. Printed circuit boards used to implement partial crossbar architectures have high wiring complexity. Thus, an MFS utilizing a partial crossbar architecture requires very expensive printed circuit boards. In contrast, the architecture of the present invention reduces a significant number of inter-chip connections required by the partial crossbar architecture. As discussed, the exact number of inter-chip connections eliminated depends on the Pp value used. Summarizing, use of the present invention in an MFS reduces board-level wiring complexity, which results in lower board costs when compared to an MFS using only a partial crossbar architecture.

Key Architecture Parameters

As discussed, a critical parameter when designing an MFS using the teachings of the present invention is Pp. As discussed, Pp is important because it affects cost, routability and speed of the MFS using the architecture of the present invention. If Pp is too high, it will lead to increased pin cost because more programmable connections are required. If Pp is too low, it may adversely affect the routability.

Experiments were performed to explore the effect of Pp on the routability and speed of an MFS using the teachings of the present invention. Fifteen different benchmark circuits, which are described in the table of FIG. 12, were mapped into an MFS using the teachings of the present invention using five different values of Pp (20 percent, 30 percent, 40 percent, 50 percent, 60 percent). Other values were not mapped because it was anticipated that the results of the other benchmarks could be interpolated to extract the results of other values of Pp. For example, it is likely that the percentage of nets routed where Pp is set to fifty-five percent would be in between the percentage of routed nets obtained at Pp at fifty percent and Pp at sixty percent.

Figure 14:
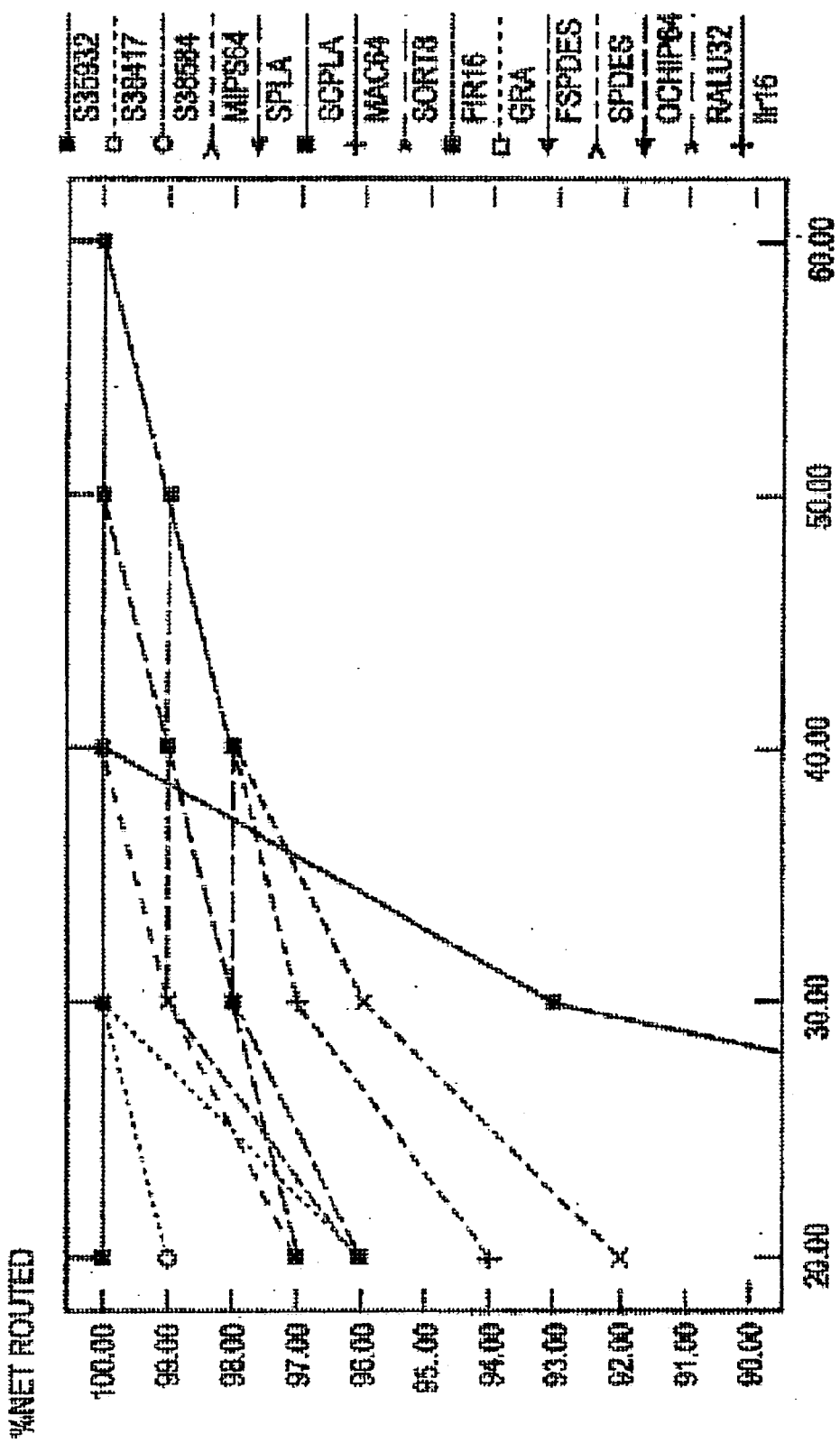
FIG. 14 is a table showing the effect of the choice of Pp (i.e., the percentage of each FPGA's pins that are connected to FPIDs) on the routability of the architecture of the present invention.

The results of these benchmarks are shown in the graph of FIG. 14. In the graph shown in FIG. 14, the Y-axis represents the percentage of inter-FPGA nets successfully routed for each circuit and the X-axis represents Pp. The first clear conclusion is that Pp of 60 percent gives one hundred percent routability for all the benchmark circuits. In addition, approximately two thirds of the circuits routed at Pp of 40% and for the remaining one third, more than 97% of the nets routed. This implies that there is a potential for obtaining one hundred percent routability for all circuits at Pp at forty percent if a routability driven partitioner like the one disclosed in *A Performance-Driven Logic Emulation System: FPGA network Design and Performance-Driven Partitioning*, C. Kim and H. Shin, IEEE Transactions on Computer Aided Design, vol. 15, no. 5, pp. 560–568, May 1996, is used. Also, if the FPGA and FPID pins are used in a time-multiplexed manner (effectively increasing the number of pins available per chip), routing completion rates should increase. This will lead to further reduced pin cost for MFSs using the teachings of the present invention. Examples of a time-multiplexed interconnect for hardware emulation systems is disclosed in International Application No. PCT/US98/10171, the disclosure of which is incorporated herein by reference in its entirety.

Experiments have also been performed to determine the effect of the selection of Pp on post-routing critical path delay. The table shown in FIG. 15 shows the ten benchmark circuits (disclosed in FIG. 12) that routed when Pp was set at less than sixty percent. The first column shows the circuit name. In subsequent columns, the critical path delay of each circuit for different values of Pp (twenty percent, thirty percent, forty percent, fifty percent, sixty percent) is shown. A surprising conclusion is that lower values of Pp had no significant effect on the critical path delay. Compared to the delay value when Pp is set at sixty percent, the delay values when Pp was lowered remained the same or decreased slightly (only four percent lower on average and twelve percent lower in the best case).

Because there are more hardwired connections when Pp is set to lower values, one would have expected higher speeds during testing MFSs having low values of Pp. This testing, however, found that speeds were not higher with low values of Pp.

It is believed that the Pp value required for routing completion of a given circuit on an MFS using the architecture of the present invention depends upon how well the circuit structure matches the topology of the architecture.

Notice that the parameter Pt, also applies to the programmable connections in the architecture of the present invention. For the same reasons as in MFSs utilizing a partial crossbar architecture, a Pt of 14 was selected for use in the MFS architecture used in our experiments.

Handling of Circuit I/O Signals

Any specific I/O signals in the circuit being implemented on an MFS using the architecture of the present invention must be routed to a specific FPGA. This specific FPGA implements the logic connecting that I/O signal. This requirement can be met in a flexible manner by reserving a suitable number of pins per FPID for I/O signals and routing each I/O signal to its assigned FPGA via an FPID. In alternative embodiment, a number of pins can be reserved on each FPGA for I/O signals. But this alternative embodiment is inflexible and wasteful of FPGA I/O pins because I/O requirements for different circuits vary and any unused pins will be wasted. It may also cause problems for the automatic partitioning and inter FPGA routing tools.

Evaluation and Comparison of MFSs Using the Architecture of the Present Invention To compare the architecture of the present invention with that of the partial crossbar, a rigorous experimental approach was performed. As discussed above, fifteen different types of real benchmark circuits, ranging in size from two thousand to six thousand 4-LUT's and flip-flops, were employed in the experimental procedure. The objective was to stress the architectures to observe where a particular architecture failed. An additional objective was to stress the mapping tools used. A final objective was to ensure that they are tested on a variety of real circuits.

Evaluation Metrics

We compared the architecture of the present invention and the partial crossbar architecture using two parameters: Pin cost and post-routing critical path delay. The cost of an MFS is likely a direct function of the number of FPGAs and FPIDs: If the routing architecture is inefficient, it will require more FPGAs and FPIDs to implement the same amount of logic as a more efficient MFS. While it is difficult to calculate the price of specific FPIDs and FPGAs, a generally accurate assumption is that the total cost is proportional the total number of pins on all of these devices. Since the exact number of FPGAs and FPIDs varies for each circuit implementation (in our procedure above, we allow the MFS to grow until routing is successful), we calculate, for each architecture, the total number of pins required to implement each circuit. We refer to this value as the pin cost metric for the architecture.

The speed of an MFS for a given circuit is determined by the critical path delay obtained after a circuit has been placed and routed at the inter-chip level. We call this the post-routing critical path delay. Post routing critical path delay for a given circuit and MFS architecture can be calculated using an MFS static timing analysis tool. One such static timing analysis tool is MTA, which is available from the University of Toronto, Toronto, Canada.

Comparison of MFSs Using the Architecture of the Present Invention and Partial Crossbar The fifteen benchmark circuits shown in the table of FIG. 12 were mapped into two different MFSs. One MFS utilized a partial crossbar architecture and the other MFS used an architecture using the teachings of the present invention. The results obtained are shown in the tables shown in FIGS. 16 and 17. In the table of FIG. 16, the first column shows the circuit name. The second column shows the number of FPGAs needed for implementing the circuit on the architecture (recall that we increase the MFS size until routing is successful). The third column shows the pin cost normalized to the number of pins used by the MFS using the architecture of the present invention. The fourth column shows the critical path delay obtained for each architecture normalized for the critical path delay of the MFS using the architecture of the present invention. The table shown in FIG. 17 is similar to the table shown in FIG. 16 except that it shows actual (i.e., non-normalized) pin cost and delay values.

The number of FPIDs used is not shown in the tables shown in FIGS. 16 and 17 because in the examples tested, the number of FPIDs was the same for each architecture tested. All the results for partial crossbar use a Pt value of seventeen. As discussed, the parameter Pt determines the number of FPIDs required and the number of FPGAs in the architecture determine the pin count of each FPID. Also discussed above, experimentation has shown that the value selected for Pt has little effect on the routability and speed of the partial crossbar. Therefore any arbitrary value of Pt can be used. However, for practical reasons, the value chosen should require FPIDs that have reasonable pin counts (about four hundred pins or less, which are commercially available) for the largest partial crossbar required in our experiments. Thus, given the equations disclosed above, a reasonable choice for Pt is seventeen.

The value of Pp for the MFSs using the architecture of the present invention was set at sixty percent so that good routability across all circuits could be obtained. Notice that the parameter Pt also applies to the programmable connections in the MFS using the architecture of the present invention for the same reasons as in the partial crossbar (given in the previous paragraph). Thus, a $P_t$ of fourteen was selected for the MFS using the architecture of the present invention.

In reviewing the table shown in FIG. 16, consider the circuit mips64, the details of which are disclosed in FIG. 12. The first partitioning attempt resulted in the need for fourteen FPGAs to implement this particular circuit in an MFS utilizing the partial crossbar architecture. However, the circuit was not routable on the MFS using the architecture of the present invention. Thus, the partitioning was repeated after reducing the number of pins per FPGA specified to the partitioner a small amount to determine if the particular benchmark circuit was routable. In this particular example, the number of pins was reduced by five percent. When the number of pins per FPGA specified to the partitioner was reduced by five percent, fifteen FPGAs were required to implement the circuit. The second partitioning attempt was routable on the MFS using the architecture of the present invention because more free pins were available in each FPGA for routing purposes. The pin cost for the partial crossbar was still more than that for MFS using the architecture of the present invention because an MFS utilizing a partial crossbar uses many more programmable connections, and hence more FPID pins. An MFS using a partial crossbar architecture always requires one. FPID pin for every FPGA pin. In contrast, an MFS using the architecture of the present invention requires a lower ratio, (approximately 0.6:1) as shown in the previous section.

Inspecting the table shown in FIG. 16, several observations can be made. First, an MFS using a partial crossbar architecture requires twenty percent more pins on average, and perhaps a much as twenty five percent more pins, when compared to an MFS using the architecture of the present invention. Thus, for certain types of designs, the architecture of the present invention is superior to the partial crossbar architecture for use in MFSs, at least in terms of the pin cost metric. This is because MFSs utilizing the architecture of the present invention exploit direct connections between FPGAs to save FPID pins that would have been needed to route certain nets in an MFS utilizing a partial crossbar architecture. However, for routability purposes, an MFS utilizing the architecture of the present invention requires some free pins in each FPGA and may require repeated partitioning attempts for some circuits.

The table shown in FIG. 16 shows that the typical circuit delay is lower in MFSs utilizing the architecture of the present invention. As seen in FIG. 16, the MFS utilizing the architecture of the present invention has significantly less delay for twelve of the benchmark circuits when compared to the MFS utilizing a partial crossbar architecture. In the remaining benchmark circuits, the MFS utilizing the architecture of the present invention had the same delay as the MFS utilizing a partial crossbar architecture. The reason the architecture of the present invention results in lower circuit delays is that the architecture of the present invention utilizes fast and direct connections between FPGAs whenever possible (e.g., when nets have a fan out of one). It is also worth nothing that even for the benchmark circuits where MFS utilizing the architecture of the present invention needed more FPGAs than the MFS utilizing the partial crossbar architecture, the MFS utilizing the architecture of the present invention still had delay characteristics that were the same or better than the MFS utilizing the partial crossbar architecture. This clearly demonstrates that the architecture of the present invention is inherently faster due to the nature of its topology. The architecture of the present invention provides significant higher speeds as compared to the partial crossbar architecture, especially when timing driven inter-FPGA routing software is used.

The table shown in FIG. 17 shows the actual pin cost and delay values obtained using the architecture of the present invention and the partial crossbar architecture.

Extension of the Present Invention in Huge Multi-FPGA Systems

Using currently available FPGA technology, the architecture of the present invention is suitable for single printed circuit board MFSs having a maximum of about twenty-five FPGAs. As FPGA logic and pin capacities continue to rise, logic capacity of the MFS will increase. Within logic capacity requirements are not exceptionally demanding, single board systems having a few high capacity FPGAs are desirable so as to avoid the problems associated with using high pin count connectors for multi-board systems. For demanding applications requiring larger gate capacities and hundreds of FPGAs, such as logic emulation, we could use groups of printed circuit boards where the FPGAs and FPIDs on each board within the group of printed circuit boards are interconnected using the using the architecture of the present invention. Each PCB is interconnected using a hierarchical partial crossbar scheme such as that disclosed in FIGS. 17–19 of U.S. Pat. No. 5,036,473. The hardwired connections, within each group of PCBs and between different PCBs would still help in reducing the overall pin cost.

An additional example of an MFS using both FPGAs and FPIDs for interconnection that has not yet been developed is seen in FIG. 18. The MFS shown in FIG. 18 comprises FPGAs 160a–160f and FPID 170. FPGAs 160a–160f have hardwired connections 165a–165f. However, hardwired connections 165a–165f do not directly connect every FPGA 160a–160f to each other. Instead, in the example shown, FPGA 160a is directly connected to FPGAs 160b–160c through hardwired connections 165a–165b. FPGA 160b is directly connected to FPGAs 160a and 160c through hardwired connections 165a and 165c. FPGA 160c is directly connected to FPGAs 160a and 160b through hardwired connections 165b and 165c. FPGA 160d is directly connected to FPGAs 160e and 160f through hardwired connections 165d and 165e. FPGA 160e is directly connected to FPGAs 160d and 160f through hardwired connections 160e and 160f. FPGA 160f is directly connected to FPGAs 160d and 160e through hardwired connections 165e and 165f.

The MFS of FIG. 18 also comprises programmable connections through one large FPID 170. Thus, programmable connections 175a exist between FPID 170 and FPGA 160a. Programmable connections 175b exist between FPGA 160b. Programmable connections 175c exist between FPGA 160c and FPID 170. Likewise, programmable connections 175f exist between FPID 170 and FPGA 160d. Programmable connections 175d exist between FPID 170 and FPGA 160e. Finally, programmable connections 175e exist between FPID 170 and FPGA 160f. The architecture of FIG. 18 is a hybrid architecture comprising a complete graph interconnect architecture along with a large FPID 170. An advantage of such an architecture topology is that it provides close to optimal routing paths for both two-terminal and multi-terminal nets (i.e., nets with fan outs greater than one). A disadvantage of such architectures is that scalability of the architecture into larger systems is difficult.

Thus, a preferred architecture for use in multi-FPGA systems is disclosed that is highly useful for verification of integrated circuits, prototyping of electronic systems, and reprogrammable computation systems. While embodiments and applications of this invention have been shown and described, as would be apparent to those skilled in the art, many more embodiments and applications are possible without departing from the inventive concepts disclosed herein. The invention, therefore is not to be restricted except in the spirit of the appended claims.

What is claimed is:

1. An electrically reconfigurable logic assembly comprising:

a printed circuit board, said printed circuit board comprising a plurality of fixed electrical conductors, said plurality of fixed electrical conductors segregated into at least a first set of fixed electrical conductors and a second set of fixed electrical conductors;

a plurality of reprogrammable logic devices disposed on said printed circuit board, each of said plurality of reprogrammable logic devices comprising configurable logic elements, each of said plurality of reprogrammable logic devices also comprising logic device input/output terminals, said logic device input/output terminals reprogrammably connectable to selected ones of said plurality of configurable logic elements;

a plurality of reprogrammable interconnect devices disposed on said printed circuit board, each of said reprogrammable interconnect devices having interconnect device input/output terminals and internal circuitry, said internal circuitry reprogrammably configurable to provide interconnections between selected ones of said interconnect device input/output terminals;

said first set of fixed electrical conductors connecting a first group of said logic device input/output terminals on said plurality of reprogrammable logic devices to said interconnect device input/output terminals on said reprogrammable interconnect devices such that each of said reprogrammable interconnect devices is connected to at least one but not all of said first group of said logic device input/output terminal on each of said plurality of reprogrammable logic devices; and said second set of fixed electrical conductors connecting a second group of said logic device input/output terminals on said plurality of reprogrammable logic devices to said second group of logic device input/output terminals on every other of said plurality of reprogrammable logic devices, such that each of said plurality of reprogrammable logic devices is in direct electrical communication with every other of said plurality of reprogrammable logic devices on said printed circuit board.

2. An electrically reconfigurable logic assembly as in claim 1, wherein each of said plurality of reprogrammable logic devices comprise programmable gate arrays.

3. An electrically reconfigurable logic assembly as in claim 1, wherein each of said plurality of reprogrammable logic devices comprise FPGAs.

4. An electrically reconfigurable logic assembly as in claim 1, wherein each said reprogrammable interconnect devices comprise programmable gate arrays.

5. An electrically reconfigurable logic assembly as in claim 1, wherein said reprogrammable interconnect devices comprise FPGAs.

6. An electrically reconfigurable logic assembly as in claim 1, further including plurality of clock conductors connected to at least some of said reprogrammable logic devices.

7. An electrically reconfigurable logic assembly as in claim 6, wherein said plurality of reprogrammable logic devices comprise additional terminals and said plurality of clock conductors comprise clock lines that are connected to said additional terminals, said plurality of clock conductors adapted to carry clock signals.

8. An electrically reconfigurable logic assembly as in claim 1, further comprising an interface structure providing signal paths for signals carrying information to or from designated ones of said configurable logic elements in said reprogrammable logic devices.

9. An electrically reconfigurable logic assembly for use in an electrically reconfigurable hardware emulation system that is configurable with a circuit design in response to the input of circuit information, said electrically reconfigurable logic assembly comprising:

a plurality of reprogrammable logic devices, each said plurality of reprogrammable logic devices comprising a plurality of configurable logic elements, each of said plurality of reprogrammable logic devices also having also having logic device input/output terminals, said logic device input/output terminals reprogrammably connectable to selected ones of said configurable logic elements, said logic device input/output terminals subdivided into a least a first group of logic device input/output terminals and a second group of logic device input/output terminals;

a plurality of reprogrammable interconnect devices, each of said reprogrammable interconnect devices having a plurality of interconnect device input/output terminals and internal circuitry, said internal circuitry reprogrammably configurable to provide interconnections between selected ones of said interconnect device input/output terminals on said plurality of reprogrammable interconnect devices;

a first set of fixed electrical conductors connecting said first group of said logic device input/output terminals on said plurality of reprogrammable logic devices to said interconnect device input/output terminals on said reprogrammable interconnect devices such that each of said reprogrammable interconnect devices is connected to at least one but not all of said logic device input/output terminals of said first group of said logic device input/output terminals on each of said plurality of reprogrammable logic device;

a second set of fixed electrical conductors connecting said second group of said logic device input/output terminals on said plurality of reprogrammable logic devices to said second group of logic device input/output terminals on every other of said plurality of reprogrammable logic devices, such that each of said plurality of reprogrammable logic devices is in direct electrical communication with every other of said plurality or reprogrammable logic devices; and an interface structure arranged to provide signal paths for signals carrying information to or from designated ones of said configurable logic elements in said reprogrammable logic devices.

10. An electrically reconfigurable logic assembly for use in an electrically reconfigurable hardware emulation system that is configurable with a circuit design in response to the input of circuit information, said electrically reconfigurable logic assembly comprising:

a plurality of FPGAs, each of said plurality of FPGAs having internal circuitry, said internal circuitry reprogrammably configurable to provide logic functions, each of said plurality of FPGAs also having FPGA input/output terminals, said FPGA input/output terminals reprogrammably connectable to said internal circuitry in said plurality of FPGAs, said FPGA input/output terminals subdivided into a least a first group of FPGA input/output terminals and a second group of FPGA input/output terminals;

a plurality of FPIDs, each of said FPIDs having FPID input/output terminals and internal circuitry, said internal circuitry reprogrammably configurable to provide interconnections between selected ones of said FPID input/output terminals;

a first set of fixed electrical conductors connecting said Bust group of said FPGA input/output terminals on said plurality of FPGAs to said FPID input/output terminals on said FPIDs such that each of said FPIDs is connected to at least one but not all of said programmable FPGA input/output terminals of said first group of FPID input/output terminals on each of said plurality of FPGAs; and a second set of fixed electrical conductors connecting said second group of said FPGA input/output terminals on said plurality of FPGAs to said second group of FPGA input/output terminals on every other of said plurality of FPGAs, such that each of said plurality of FPGAs is in direct electrical communication with every other of said plurality of FPGAs.

11. An electrically reconfigurable logic board fox use in an electrically reconfigurable hardware emulation system that is configurable with a circuit design in response to the input of circuit information, said electrically reconfigurable logic assembly comprising:

a logic board structure comprising a printed circuit board;

a plurality of FPGAs mounted on said logic board structure, each of said plurality of FPGAs having internal circuitry, said internal circuitry reprogrammbly configurable to provide logic functions, each of said plurality FPGAs also having FPGA input/output terminals, said FPGA input/output terminals reprogrammbly connectable to said internal circuitry in said plurality FPGAs;

a plurality of FPIDs mounted on said logic board structure, each of said FPIDs having FPID input/output terminals and internal circuitry, said internal circuitry reprogrammably configurable to provide interconnections between selected ones of said FPID input/output terminals;

a first set of fixed electrical conductors connecting a first group of said FPGA FPIDs such that each of said FPIDs is connected to at least one but not all of said FPGA input/output terminals of said first group of said FPGA input/output, terminals on each of said plurality of FPGAs; and a second set of fixed electrical conductors connecting a second group of said FPGA input/output terminals on said plurality of FPGAs to said second group of FPGA input/output terminals on every other of said plurality of FPGA, such that each of said plurality of FPGAs is in direct electrical communication with every other of said plurality of FPGAs on said logic board structure.

12. An electrically reconfigurable logic board as in claim 11, wherein said first set of fixed electrical conductors and said second set of fixed electrical conductors comprise printed circuit board traces.

13. A hardware logic emulation system comprising:

a printed circuit board comprising a surface and a plurality of traces;

a plurality of programmable logic devices installed on said surface of said printed circuit board, said programmable logic devices reprogrammably configurable to provide logic functions said plurality of programmable logic devices comprising a plurality of logic device input/output pins segregated into at least a first subset of logic device input/output pins and a second subset of logic device input/output pins;

a plurality of programmable interconnect devices installed on said surface of said printed circuit board, said programmable interconnect devices interconnect device input/output terminals and internal circuitry, said internal circuitry reprogrammably configurable to provide interconnections between selected ones of said interconnect device input/output terminals;

said plurality of traces subdivided into at least a first subset of traces and a second subset of traces, said first subset of traces joining said first subset of logic device input/output pins to at least some of said interconnect device input/output terminals in a partial crossbar interconnect arrangement, said second subset of traces joining said second subset of logic device input/output pins such that each of said plurality of programmable logic devices is in direct electrical communication with every other of said plurality of programmable loge devices on said printed circuit board.

* * * * *